United States Patent [19]

Shiraki et al.

[11] Patent Number: 5,494,777
[45] Date of Patent: Feb. 27, 1996

[54] RADIATION SENSITIVE RESIN COMPOSITION

[75] Inventors: Shinji Shiraki; Hidetoshi Miyamoto, both of Yokkaichi; Masaaki Inoue, Suzuka; Toshiyuki Ota, Yokkaichi; Yoshiji Yumoto, Yokkaichi; Takao Miura, Yokkaichi, all of Japan

[73] Assignee: Japan Synthetic Rubber Co., Ltd., Tokyo, Japan

[21] Appl. No.: 229,677

[22] Filed: Apr. 19, 1994

[30] Foreign Application Priority Data

Apr. 20, 1993 [JP] Japan .................. 5-093332

[51] Int. Cl.$^6$ ........................ G03C 1/492
[52] U.S. Cl. .......................... 430/270; 430/281
[58] Field of Search ........................ 430/270, 281

[56] References Cited

U.S. PATENT DOCUMENTS

| | | | |
|---|---|---|---|
| 3,954,475 | 5/1976 | Bonham et al. | 96/67 |
| 3,987,037 | 10/1976 | Bonham et al. | 260/240 D |
| 4,189,323 | 2/1980 | Buhr | 430/281 |
| 5,057,397 | 10/1991 | Miyabe et al. | 430/270 |
| 5,258,257 | 11/1993 | Sinta et al. | 430/270 |
| 5,322,650 | 6/1994 | Endo et al. | |

FOREIGN PATENT DOCUMENTS

| | | |
|---|---|---|
| 0458325 | 11/1991 | European Pat. Off. . |
| 0483693 | 5/1992 | European Pat. Off. . |
| 0519298 | 12/1992 | European Pat. Off. . |
| 2-217855 | 8/1990 | Japan . |
| 4-136859 | 5/1992 | Japan . |
| 5-313370 | 11/1993 | Japan . |
| WO88/02878 | 4/1988 | WIPO . |

*Primary Examiner*—Mark Chapman
*Attorney, Agent, or Firm*—Oblon, Spivak, McClelland, Maier & Neustadt

[57] ABSTRACT

A radiation sensitive resin composition which can be suitably used as a negative type resist having a high sensitivity, a high resolution, a high yield of residual film thickness and high thermal resistance, and which comprises (A) an alkali-soluble novolak resin, (B) a phenolic compound having a standard polystyrene-reduced weight average molecular weight of 10,000 or less such as polyvinylphenol, (C) a compound capable of cross-linking the component (A) and/or the component (B) in the presence of an acid, and (D) a radiation sensitive acid generator such as a triazine compound having a halomethyl group.

18 Claims, No Drawings

RADIATION SENSITIVE RESIN COMPOSITION

BACKGROUND OF THE INVENTION

This invention relates to a radiation sensitive resin composition, and more particularly, to a radiation sensitive resin composition suitable as a negative type resist for preparing an integrated circuit sensitive to radiations such as ultraviolet rays, deep ultraviolet rays, X rays, electron beams, molecular beams, γ rays, synchrotron radiations, proton beams and the like.

In the field of fine processing, a representative of which is the production of an integrated circuit element, a lithographic process enabling fine processing of 0.5 μm or less is now being developed in order to obtain a higher integration degree. Simultaneously therewith, there has recently been increased the demand of a resist excellent in thermal resistance, resistance to ion beams and the like which resist is used in the form of a thick film in a high-energy ion implantation processing.

Conventional typical resists which have been used in the lithographic process are negative type resists using a cyclized rubber and a bisazide compound and positive type resists using a novolak resin and a quinonediazide compound.

However, the performance of each of the above resists approaches its limit, and a difficulty accompanies the use of the resist in the fine processing of 0.5 μm or less.

For example, in the negative type resist, fine patterns contact one another owing to the swelling of the resist during development. Also, when the positive type resist is irradiated with deep ultraviolet rays, the absorption of the rays by the resist is too strong and the sectional shape of the pattern becomes a triangle. When the positive type resist is irradiated with a high energy radiation such as electron beam or X rays the resist is cured to be converted into a negative type. Accordingly, it has been difficult to obtain a suitable fine pattern.

Also, all the above resists have low thermal resistance at high temperatures of 150° C. or more and are not suitable for use in the high-energy ion implantation processing.

SUMMARY OF THE INVENTION

An object of this invention is to provide a radiation sensitive resin composition which has a good sensitivity in such a wavelength range as g ray (wavelength 435.8 nm; g-line of High Pressure Mercury Arc Lamp Spectrum), i ray wavelenth 365 nm; i-line of High Pressure Mercury Arc Lamp Spectrum), deep ultraviolet ray (e.g. deep UV) and the like and has a good developability, can form an excellent pattern and is suitable as a negative type resist having a high yield of residual film thickness and high thermal resistance.

Other objects and advantages of this invention will become apparent from the following description.

According to this invention, there is provided a radiation sensitive resin composition, which comprises:

(A) an alkali-soluble novolak resin, (B) a phenolic compound having a standard polystyrene-reduced weight average molecular weight of 10,000 or less as measured by a gel permeation chromatography (referred to hereinafter as the phenolic compound), (C) a compound capable of cross-linking the above component (A) and/or the component (B) in the presence of an acid (referred to hereinafter as the crosslinker), and (D) a radiation sensitive acid generator selected from the group consisting of compounds represented by formulas (I), (II) and (III):

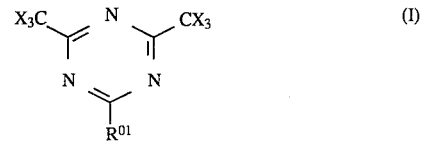

wherein $R^{01}$ represents a trihalomethyl group, a substituted or unsubstituted phenyl group or a substituted or unsubstituted naphthyl group and X's may be the same as or different from one another and each represents a halogen atom,

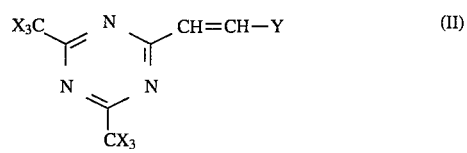

wherein X's may be the same as or different from one another and each represents a halogen atom and Y represents a

group or a

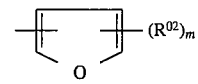

group in which $R^{02}$ represents a hydrogen atom, an alkyl group, a hydroxyl group or an alkoxy group and m represents an integer of 1 to 5, provided that when m is 2 or more, plural $R^{02}$ groups may be the same as or different from one another, and

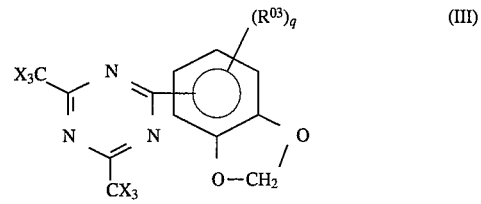

wherein $R^{03}$ represents a hydrogen atom, an alkyl group, a hydroxyl group or an alkoxy group, X's may be the same as or different from one another and each represents a halogen atom and q is an integer of 1 to 3, provided that when q is 2 or 3 the plural $R^{03}$ groups may be the same as or different from one another.

DETAILED DESCRIPTION OF THE INVENTION

Novolak Resin

The novolak resin used in this invention is alkali-soluble and obtained by polycondensing a phenol, preferably a phenol mixture containing m-cresol, with an aldehyde. As other phenols than m-cresol used in the production of such a novolak resin (said other phenols are referred to hereinafter merely as the phenolic monomers), there are advantageously used, for example, phenol, p-cresol, o-cresol, 2,3-xylenol, 2,5-xylenol, 3,5-xylenol, 2,3,5-trimethylphenol, catechol, resorcinol, hydroquinone, methylhydroquinone, pyrogallol, phloroglucinol and the like. These phenolic monomers may be used alone or in combination of two or more, preferably in combination with m-cresol. The blending ratio of m-cresol to the phenolic monomers is preferably in the range of 20/80 to 100/0 by mole, more preferably in the range of 30/70 to 100/0. When the proportion of m-cresol is less than 20 mole %, the resolution of the composition shows a tendency to lower.

The objective novolak resin is obtained by polycondensing these phenols with aldehydes such as formaldehyde, acetaldehyde and the like in the presence of an acid catalyst such as oxalic acid or the like.

The novolak resin used in this invention has preferably a standard polystyrene-reduced weight average molecular weight (referred to hereinafter as Mw) of 2,000 to 30,000, particularly preferably 3,500 to 20,000. When Mw exceeds 30,000, the developability of the composition shows a tendency to deteriorate and when Mw is less than 2,000, the film-formability of the composition shows a tendency to deteriorate.

In the radiation sensitive resin composition of this invention, the above-mentioned novolak resins may be used alone or in combination of two or more.

Phenolic Compound

The phenolic compounds used in this invention are those having Mw of 10,000 or less other than the novolak resin which is the component (A).

The above phenolic compound includes, for example, polyvinylphenols having Mw of 10,000 or less and other phenolic compounds having Mw of 1,000 or less than the polyvinylphenols (said other phenolic compound is referred to hereinafter as the low molecular weight phenolic compound), and these are preferable. Particularly preferable are polyvinylphenols having Mw of 10,000 or less.

The polyvinylphenols include, for example, poly(o-vinylphenol), poly(m-vinylphenol), poly(p-vinylphenol), poly(α-methyl-p-hydroxystyrene), poly(4-hydroxy-3-methylstyrene), copolymer of them and the like. These polyvinylphenols can be obtained by cationic polymerization of monomers, which is composed of the corresponding monomers, using boron trifluoride, hydrogen iodide or the like as a polymerization initiator or by radical polymerization of the monomers using azobisisobutyronitrile, benzoyl peroxide or the like as a polymerization initiator. Alternatively, they may be commercially available as MARUKALYNCUR-M (manufactured by Maruzen Petrochemical Co., Ltd.). The Mw of the polyvinylphenol used in this invention is preferably in the range of 1,000 to 10,000. When the Mw exceeds 10,000, undeveloped portions remain in the pattern formed and hence said Mw is not desirable. The amount of the polyvinylphenol used is preferably 0.1 to 300 parts by weight, more preferably 1 to 150 parts by weight, per 100 parts by weight of the novolak resin of the component (A). When the amount is less than 0.1 part by weight, the yield of residual film thickness of the composition of this invention is deteriorated and when the amount is more than 300 parts by weight, the resolution of the composition is deteriorated. These polyvinylphenols may be used alone or in combination of two or more.

Low Molecular Weight Phenolic Compound

The low molecular weight phenolic compound used in this invention is a phenolic compound having a molecular weight of 1,000 or less. When the molecular weight of the low molecular weight phenolic compound exceeds 1,000, the resolution is deteriorated. Such low molecular weight phenolic compounds include those having the structures represented by the following structural formulas:

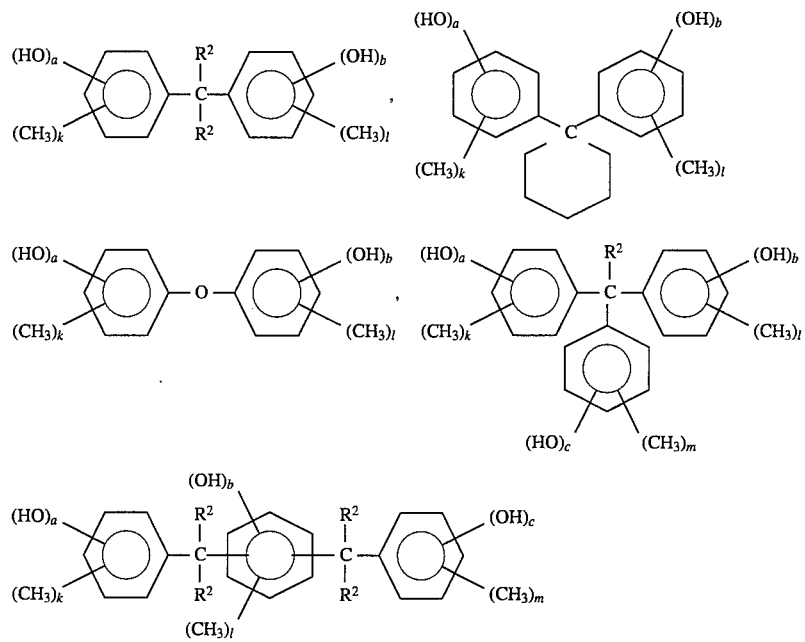

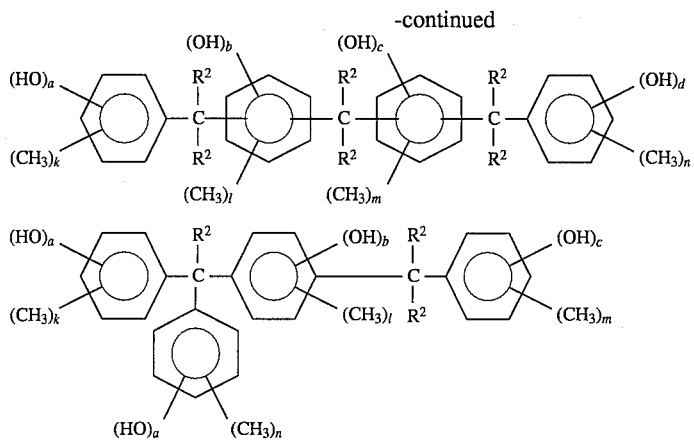

wherein R2's may be the same as or different from one another and each represents a hydrogen atom or a methyl group, each of a, b, c, d, k, l, m and n represents an integer of 0 to 3, provided that $a+b+c+d \geq 2$.

These low molecular weight phenolic compounds may be used alone or in combination of two or more, and also in combination with the above-mentioned polyvinylphenols. The amount of the low molecular weight phenolic compound used is preferably 0.1 to 200 by weight, more preferably 1 to 100 parts by weight, per 100 parts by weight of the novolak resin of the component (A). When the amount is less than 0.1 part by weight, the yield of residual film thickness of the composition of this invention tends to be deteriorated, and when the amount is more than 200 parts by weight, the sensitivity of the composition tends to be reduced.

Incidentally, when these low molecular weight phenolic compounds are used in combination with the polyvinylphenols, the total amount of them is preferably 0.1 to 300 parts by weight, more preferably 1 to 150 parts by weight, per 100 parts by weight of the novolak resin. The total amount is less than 0.1 part, the yield of residual film thickness of the composition of this invention is deteriorated and when the total amount exceeds 300 parts by weight, the resolution of the composition becomes low.

Crosslinker

The crosslinker used in this invention is a compound capable of cross-linking the component (A) and the component (B) by, for example, heating, in the presence of an acid and includes those having a methylol group and/or an alkoxymethyl group. As such a crosslinker, preferable are, for example, a urea-formaldehyde resin, a thiourea-formaldehyde resin, a melamine-formaldehyde resin, a guanamine-formaldehyde resin, a benzoguanamine-formaldehyde resin, a glycoluril-formaldehyde resin and the above-mentioned polyvinylphenols or low molecular weight phenolic compound having introduced thereinto a methylol group and/or an alkoxymethyl group and the like, and particularly preferable are compounds represented by the following formulas (IV) to (VII) and/or oligomers whose monomers are these compounds and whose Mw is, for example, 1,500 or less:

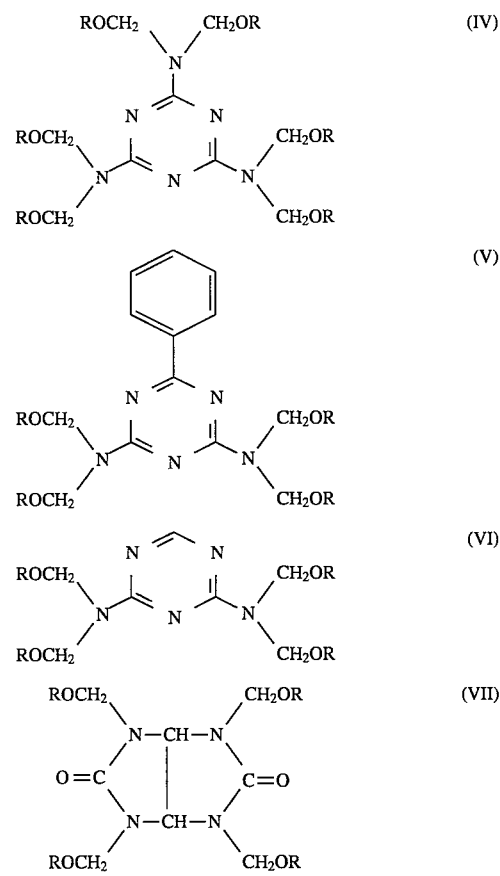

wherein R's may be the same as or different from one another and each represents a hydrogen atom or an alkyl group having 1 to 6 carbon atoms. The most preferable crosslinker is the compound represented by formula (IV) and/or oligomers whose monomer is this compound and whose Mw is 1,500 or less. The compounds represented by formula (IV) are commercially available as, for example, CYMEL (a trade name of Mitsui Cyanamid Co., Ltd.) and Nikalac (a trade name of Sanwa Chemical Co., Ltd.). These crosslinkers may be used alone or in combination of two or more. The amount of the crosslinker used is preferably 1 to 100 parts by weight, more preferably 5 to 75 parts by weight, per 100 parts by weight in total of the novolak resin of the component (A) and the phenolic compound of the component (B) [the component (A) and the component (B) are collectively referred to hereinafter as the alkali-soluble compound]. When the amount of the crosslinker used is less than 1 part by weight, the sufficient curing of the irradiated portions of the composition becomes difficult, and when the amount exceeds 100 parts by weight, the resolution of the composition tends to be reduced.

Radiation Sensitive Acid Generator

The radiation sensitive acid generator agent used in this invention is a compound represented by the following formulas (I), (II) and (III) which generates an acid upon irradiation with a radiation:

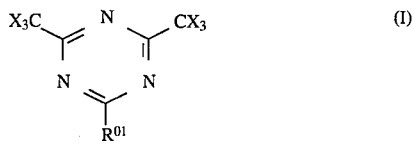

wherein $R^{01}$ represents a trihalomethyl group, a substituted or unsubstituted phenyl group or a substituted or unsubstituted naphthyl group, and X's may be the same as or different from one another and each represents a halogen atom,

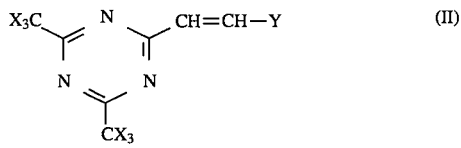

wherein X's may be the same as or different from one another and each represents a halogen atom, Y represents

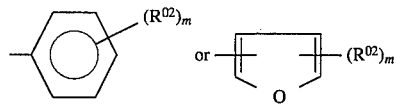

in which $R^{02}$ represents a hydrogen atom, an alkyl group, a hydroxyl group or an alkoxy group, and m is an integer of 1 to 5, provided that when m is 2 or more, the plural $R^{02}$ groups may be the same as or different from one another, and

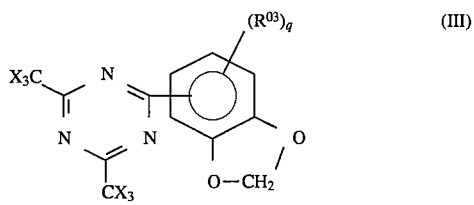

wherein $R^{03}$ represents a hydrogen atom, an alkyl group, a hydroxyl group or an alkoxy group, X's may be the same as or different from one another and each represents a halogen atom and q is an integer of 1 to 3, provided that when q is 2 or more the plural $R^{03}$ groups may be the same as or different from one another.

The compounds represented by formula (I) include, for example, 2,4,6-tris(trichloromethyl)-1,3,5-triazine, 2,4,6-tris(tribromomethyl)-1,3,5-triazine, 2-phenyl- 4,6-bis-(trichloromethyl)-1,3,5-triazine, 2- phenyl-4,6-bis(tribromomethyl)-1,3,5-triazine, 2-(4-methoxypheny)- 4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)- 1,3,5-triazine, 2-(4-methoxy-1-naphthyl)-4,6-bis(tribromomethyl)- 1,3,5-triazine, 2-( 4-chlorophenyl )- 4,6-bis(trichloromethyl)-1,3,5-triazine, 2-(4-chloropheynl)- 4,6-bis(tribromomethyl)-1,3,5-triazine, 2-( 3-chlorophenyl)-4,6-bis(trichloromethyl)-1,3,5-triazine, 2-(3-chlorophenyl)-4,6-bis(tribromomethyl)- 1,3,5-triazine and the like.

The compounds represented by formula (II) include, for example, 2-styryl-4,6-bis(trichloromethyl)- 1,3,5-triazine, 2-styryl-4,6-bis(tribromomethyl)-1,3,5-triazine, 2-(4-methoxystyryl)-4,6-bis(trichloromethyl)- 1,3,5-triazine, 2-(4-methoxystyryl)-4,6-bis(tribromomethyl)- 1,3,5-triazine, 2-(3,4,5-trimethoxystyryl)-4,6-bis(trichloromethyl)- 1,3,5-triazine, 2-(3,4,5-trimethoxystyryl)- 4,6-bis(tribromomethyl)-1,3,5-triazine, 2-(2-furylethylidene)-4,6-bis(trichloromethyl)- 1,3,5-triazine, 2-[2-(5-methylfuryl)ethylidene]- 4,6-bis(trichloromethyl)-1,3,5-triazine, 2-[2-(4-methylfuryl) ethylidene] -4,6-bis(trichloromethyl)-1,3,5-triazine, 2-[2-(3-methylfuryl)ethylidene]-4,6-bis(Trichloromethyl)- 1,3,5-triazine, 2-[2-(4,5-dimethylfuryl)ethylidene] -4,6-bis(trichloromethyl)-1,3,5-triazine, 2-[2-(5-methoxyfuryl)ethylidene]- 4,6-bis(trichloromethyl)- 1,3,5-triazine, 2-[2-(4-methoxyfuryl)ethylidene)-4,6-bis(trichloromethyl)-1,3,5-triazine, 2-[2-(3-methoxyfuryl)ethylidene] -4,6-bis(trichloromethyl)-1,3,5-triazine, 2-[2-(4,5-dimethoxyfuryl)ethylidene]-4,6-bis-(trichloromethyl)- 1,3, 5-triazine, 2-(2-furylethylidene)- 4,6-bis(tribromomethyl)-1,3,5-triazine, 2-[2-(5-methyl-furyl)ethylidene] -4,6-bis(tribromomethyl)-1,3,5-triazine, 2-[2-(4-methylfuryl)ethylidene]-4,6-bis(tribromomethyl)- 1,3,5-triazine, 2-[2-(3-methylfuryl)ethylidene] -4,6-bis(tribromomethyl)-1,3,5-triazine, 2-[2-(4, 5dimethylfuryl)ethylidene] -4,6-bis(tribromomethyl)-1,3, 5triazine, 2-[2-(5-methoxyfuryl)ethylidene]-4,6-bis(tribromethyl)- 1,3,5-triazine, 2-[2-(4-methoxyfuryl)-ethylidene)- 4,6-bis(tribromomethyl)-1,3,5-triazine, 2-[ 2-(3-methoxyfuryl)ethylidene]-4,6-bis(tribromomethyl)- 1,3,5-triazine, 2-[2-(4,5-dimethoxyfuryl)ethylidene]- 4,6-bis(tribromomethyl)-1,3,5-triazine and the like.

The compounds represented by formula (III) include, for example, 2-[1-(3,4-benzodioxolyl)]-4,6-bis(trichloromethyl)- 1,3,5-triazine, 2-[1-(2,3benzodioxolyl)] -4,6-bis-(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)- 1,3,5-triazine and the like.

These radiation sensitive acid generators may be used alone or in combination of two or more. Also, they may be used in combination with other radiation sensitive acid generators having different structures from the above-mentioned compounds.

The amount of the radiation sensitive acid generator used is preferably 0.01 to 20 parts by weight, more preferably 0.1 to 10 parts by weight, per 100 parts by weight of the alkali-soluble compounds. When the amount of the radiation sensitive acid generator is less than 0.01 part by weight or exceeds 20 parts by weight, the shape of the resist pattern obtained tends to become inferior.

Additives

The composition of this invention may, if necessary, have added thereto various additives.

Such additives include, for example, surfactants for improving the coatability of the composition, a striation of the resist film and the developability of the irradiated portions after the formation of a resist film. Such surfactant includes, for example, polyoxyethylene lauryl ether, polyoxyethylene stearyl ether, polyoxyethylene oleyl ether, polyoxyethylene octylphenol ether, polyoxyethylene nonylphenol ether, polyethylene glycol dilaurate, polyethylene glycol distearate and the like. Also, there may be used fluorine-containing surfactant such as F Top EF301, EF303 and EF352 (trade names of Shin Akita Kasei K. K.), Megafac F171 and F173 (trade names of DAINIPPON INK & CHEMICALS, INC.), Fluorad FC430 and FC431 (trade names of Sumitomo 3M Limited), Asahi Guard AG710 and Surflon S-382, SC-101, SC-102, SC-103, SC-104, SC-105 and SC-106 (trade names of Asahi Glass Co., Ltd.) and the like; KP341 (a trade name of Shin-Etsu Chemical Co., Ltd. for organosiloxane polymer); Polyflow No. 75 and No. 95 (trade names of Kyoeisha Yushikagaku Kogyo K. K. for acrylic and methacrylic acid polymers); etc.

The amount of the surface active agent used is preferably 2 parts by weight or less per 100 parts by weight of the alkali-soluble compound.

As other additives, there are mentioned, for example, sensitizers, halation-preventing agents, adhesion adjuvants, storage stabilizers, defoaming agents and the like.

Solvent

The composition of this invention can be prepared in the form of a solution by dissolving the novolak resin, the phenolic compound, the crosslinker, the radiation sensitive acid generator and optional various additives in the respective necessary amounts in a solvent. The solution thus prepared is usually filtered through a filter having a pore diameter of about 0.2 μm.

The solvent used in this case includes, for example, ethylene glycol monomethyl ether, ethylene glycol monoethyl ether, ethylene glycol monopropyl ether, ethylene glycol monobutyl ether, diethylene glycol dimethyl ether, diethylene glycol diethyl ether, diethylene glycol dipropyl ether, diethylene glycol dibutyl ether, ethylene glycol monomethyl ether acetate, ethylene glycol monoethyl ether acetate, propylene glycol monomethyl ether acetate, propylene glycol monoethyl ether acetate, propylene glycol monopropyl ether acetate, toluene, xylene, methyl ethyl ketone, cyclohexanone, 2-heptanone, 3-heptanone, 4-heptanone, methyl 2-hydroxypropionate, ethyl 2-hydroxypropionate, ethyl 2-hydroxy-2-methylpropionate, ethyl ethoxyacetate, ethyl hydroxyacetate, 2-hydroxy-3-methoxybutyl acetate, 3-methyl-3-methoxybutyl propionate, 3-methyl-3methoxybutyl butyrate, ethyl acetate, butyl acetate, methyl acetoacetate, ethyl acetoacetate, ethyl pyruvate, methyl 3-methoxypropionate, ethyl 3-ethoxypropionate, N-methylpyrrolidone, N,N-dimethylformamide, N,N-dimethylacetamide and the like.

These solvents may, if necessary, have added thereto a high-boiling point solvent such as benzyl ethyl ether, dihexyl ether, diethylene glycol monomethyl ether, diethylene glycol monoethyl ether, acetonylacetone, isophorone, caproic acid, caprylic acid, 1-octanol, 1-nonanol, benzyl alcohol, benzyl acetate, ethyl benzoate, diethyl oxalate, diethyl maleate, butyrolactone, ethylene carbonate, propylene carbonate, ethylene glycol monophenyl ether acetate and the like.

Pattern Formation

The composition of this invention is applied in the form of the above-mentioned solution to a substrate such as silicon wafer or the like and then dried to form a resist film. In this case, the application to the substrate is, for example, effected by dissolving the composition of this invention in the above-mentioned solvent so that the solids concentration becomes 5 to 60% by weight, filtering the resulting solution and thereafter coating the solution on the substrate by a spin coating, a flow coating, a roll coating or the like.

The resist film thus formed is partially irradiated with a radiation to form a fine pattern. As this radiation, there may be used radiations, for example, ultraviolet rays, deep ultraviolet rays (including excimer laser), X rays, γ rays, electron beam, molecular beam, synchrotron radiation, proton beam and the like depending upon the kind of the radiation sensitive compound used.

The irradiation conditions such as radiation dose and the like may be appropriately varied depending upon the proportions of the components in the composition, the kind of the additives and the like.

In this invention, it is suitable to heat the resist after the irradiation to increase its sensitivity and the like. The heating temperature may be varied depending on the proportions of the components in the composition, the kind of the additives and the like; however, it is preferably 30° to 200° C., more preferably 50° to 150° C.

The developer used in the development to be subsequently effected includes, for example, aqueous alkaline solutions prepared by dissolving in water sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[ 5.4.0]-7-undecene, 1,5-diazabicyclo[4.3.0]- 5-nonene or the like.

The above developer may have appropriately added thereto a water-soluble organic solvent, for example, an alcohol such as methanol, ethanol or the like and a surfactant.

Also, the resist film is rinsed with water after the development with the above developer and then dried.

Incidentally, as the developer, it is also possible to use those solvents which are used in the preparation of the above composition solution; ketones such as acetone, methyl ethyl ketone, methyl isobutyl ketone and the like; and alcohols such as methanol, ethanol, isopropanol and the like; however, the above-mentioned aqueous alkaline solution is more preferable in respect of resolution.

The radiation sensitive resin composition of this invention is not swollen with a developer, is excellent in sensitivity (photospeed) and resolution in a wavelength range of g rays, i rays, deep ultraviolet rays and the like, can form an excellent pattern, and is suitable as a negative type resist having a high yield of residual film thickness and high thermal resistance.

DESCRIPTION OF THE PREFERRED EMBODIMENTS

This invention is explained in more detail below referring to Examples; however, this invention is not limited thereto.

In the Examples, the measurement of Mw and evaluation of resists were conducted by the following methods:

Mw

Measured by a gel permeation chromatography, in which a monodisperse polystyrene was used as a standard, using GPC columns manufactured by TOSOH CORP. (two G2000H$_{XL}$ columns, one G3000H$_{XL}$ column and one G4000H$_{XL}$ column), under such analysis conditions that the flow rate was 1.0 milliliter/min, the eluent was tetrahydrofuran and the column temperature was 40° C.

Photospeed as sensitivity (Examples 1 to 4 and Comparative 1 and 2)

Exposure was effected at a varying exposure time using g rays having a wavelength of 436 nm in a NSR-1505G6E stepper manufactured by NIKON CORP. (numerical aperture of lens: 0.54), or at a varying exposure time using i rays having a wavelength of 365 nm in a NSR-1755i7A stepper manufactured by NIKON CORP. (numerical aperture of lens: 0.50), or at a varying exposure time using excimer laser having a wavelength of 248 nm in a MBK-400TL-N exposure device manufactured by ADMON SCIENCE INC. Subsequently, development was effected with a 2.38% by weight aqueous tetramethyl-ammonium hydroxide solution, and the developed resist was rinsed with water and then dried to form a resist pattern on a wafer. When g rays were used for the exposure, the exposure dose in which a line-and-space pattern of 0.6 μm (1L1S) was formed in a 1:1 width was determined and when i rays or excimer laser was used for the exposure, the exposure dose in which a line-and-space pattern of 0.5 μm (1L1S) was formed in a 1:1 width was determined (said exposure doses are each referred to hereinafter as the optimum exposure dose).

Photospeed as sensitivity (Examples 5 to 8 and Comparative Example 3):

Exposure was effected at a varying exposure time using i rays having a wavelength of 365 nm in a NSR-1505i6A stepper (numerical aperture of lens: 0.45), or at a varying exposure time using g rays having a wavelength of 435 nm in a NSR-1505G4D stepper (numerical aperture of lens: 0.45). Subsequently, development was effected with a 2.38% by weight aqueous tetramethyl-ammonium hydroxide solution, and the developed resist was rinsed with water and then dried to form a resist pattern on a wafer. When the film thickness was 1.0 μm, the exposure dose in which a line-and-space pattern of 0.5 μm (1L1S) was formed in a 1:1 width was determined and when the film thickness was 5.6 μm, the exposure dose in which a line-and-space pattern of 2.0 μm (1L1S) was formed in a 1:1 width was determined (said exposure doses are each referred to hereinafter as the optimum exposure dose).

Resolution

The dimension of the minimum resist pattern resolved when exposure was effected in the optimum exposure dose was measured.

Yield of residual film thickness

The thickness of the pattern after the development in the optimum exposure dose was divided by the thickness of the resist film before the development and the value thus obtained was multiplied by 100 to determine the percentage.

Thermal resistance

On a hot plate whose temperature was varied by five degrees, a wafer having formed thereon a resist pattern was heated for 120 seconds, and thereafter, the sectional shape of the resist pattern was observed to determine the temperature at which the rectangular shape of the resist pattern was broken.

EXAMPLE 1

In 27.0 g of methyl 3-methoxypropionate were dissolved 7.0 g of a novolak resin (Mw=8,000) prepared by polycondensing a mixed phenol of m-cresol/3,5-xylenol=70/30 by mole with formalin (referred to hereinafter as the novolak resin A), 3.0 g of polyvinylphenol (Mw= 4,500), 3.0 g of hexamethoxymethylmelamine and 0.25 g of 2-(4-methoxy-1-naphthyl)-4,6-bis(trichloromethyl)-1,3,5-triazine, and the resulting solution was filtered through a membrane filter having a pore diameter of 0.2 μm to prepare a composition solution. This composition solution was spin-coated on a 4-inch silicon wafer by a spinner so that the film thickness became 1.0 μm, and prebaked on a hot plate at 90° C. for 120 seconds to form a resist film. This resist film was exposed to i rays through a test reticle and then baked on a hot plate at 90° C. for 120 seconds. This was developed with a 2.38% by weight aqueous tetramethylammonium hydroxide solution at 23° C. for 60 seconds. After the development, the resist film was observed by a scanning type electron microscope to find that the photospeed was 130 mJ/cm$^2$ and a negative type line-and-space pattern of 0.36 μm was obtained. In this case, the yield of residual film thickness was 95%.

EXAMPLE 2

In 27.0 g of methyl 3-methoxypropionate were dissolved 6.0 g of a novolak resin (Mw=7,400) prepared by polycondensing a mixed phenol of m-cresol/p-cresol= 50/50 by mole with formalin (referred to hereinafter as the novolak resin B), 3.0 g of polyvinylphenol (Mw= 4,500), 1.0 g of bisphenol A which is a low molecular weight phenolic compound, 2.5 g of 2,2-bis[4-hydroxy- 3,5-bis(methoxymethyl)phenyl] propane and 0.25 g of 2-(3-chloropheyny)-4,6-bis(trichloromethyl)-1,3,5-triazine, and the resulting solution was filtered through a membrane filter having a pore diameter of 0.2 μm to prepare a composition solution. This composition solution was spin-coated on a 4-inch silicon wafer by a spinner so that the film thickness became 1.0 μm, and prebaked on a hot plate at 90° C. for 120 seconds to form a resist film. A mask was intimately contacted with this resist film and the resulting assembly was exposed through the mask to excimer laser and then baked on a hot plate at 100° C. for 120 seconds. This resist film was developed in the same manner as in Example 1 to find that the photospeed was 30 mJ/cm$^2$, and a negative type line-and-space pattern of 0.34 μm was obtained. In this case, the yield of residual film thickness was 93%.

EXAMPLE 3

The same procedure as in Example 1 was repeated, except that the novolak resin A was replaced with 7.0 g of a novolak resin (Mw=7,400) prepared by polycondensing a mixed phenol of m-cresol/p-cresol= 50/50 by mole with formalin and the polyvinylphenol (Mw=4,500) was replaced with 3.0 g of 1,1,1-tris(4-hydroxyphenyl)ethane, to find that the photospeed was 125 mJ/cm$^2$, and a negative type line-and-space pattern of 0.38 μm was obtained. In this case, the yield of residual film thickness was 92%.

EXAMPLE 4

The same composition solution as in Example 1, except that the novolak resin A was replaced with 7.0 g of a novolak resin (Mw=7,800) prepared by polycondensing m-cresol with formalin, was spin-coated on a 4-inch silicon wafer by a spinner so that the film thickness became 1.2 μm and prebaked on a hot plate at 90° C. for 120 seconds. This was exposed through a test reticle to g rays, and the exposed resist was baked on a hot plate at 105° C. for 120 seconds. The thus baked resist was developed in the same manner as in Example 1 to find that the photospeed was 150 mJ/cm$^2$ and a negative type line-and-space pattern of 0.42 μm was obtained. In this case, the yield of residual film thickness was 93%.

COMPARATIVE EXAMPLE 1

The same procedure as in Example 2 was repeated, except that the 0.25 g of 2-(3-chlorophenyl)- 4,6-bis(trichloromethyl)-1,3,5-triazine was replaced with 0.25 g of a condensation product of 1.0 mole of 2,3,4-trihydroxybenzophenone with 2.6 moles of 1,2-naphthoquinonediazide- 4-sulfonic acid chloride. A resolution of only 0.6 μm was obtained and the yield of residual film thickness was 81%.

COMPARATIVE EXAMPLE 2

The same procedure as in Example 1 was repeated, except that the amount of the novolak resin A was changed to 10.0 g and the polyvinylphenol was not used. A resolution of only 0.7 μm was obtained and the yield of residual film thickness was 74%.

EXAMPLE 5

In 27.0 g of methyl 3-methoxypropionate were dissolved 7.0 g of the novolak resin A, 3.0 g of polyvinylphenol (Mw=4,500), 2.0 g of hexamethoxy-methylmelamine and 0.1 g of 2-(4-methoxystyryl)-4,6-bis(trichloromethyl)- 1,3,5-triazine, and the resulting solution was filtered through a membrane filter having a pore diameter of 0.2 μm to prepare a composition solution. This composition solution was spin-coated on a 4-inch silicon wafer by a spinner so that the film thickness became 1.0 μm and then prebaked on a hot plate at 90° C. for 120 seconds. This was exposed through a test reticle to i rays and then baked on a hot plate at 90° C. for 120 seconds. The thus baked resist was developed with a 2.38% by weight aqueous tetramethylammonium hydroxide solution at 25° C. for 60 seconds. After the development, the developed resist was observed by a scanning type electron microscope to find that the photospeed was 90 mJ/cm$^2$, and a negative type line-andspace pattern of 0.38 μm was obtained. In this case, the yield of residual film thickness was 95%.

The wafer having formed thereon said resist pattern was subjected to measurement of thermal resistance on a hot plate to find that the pattern was not deformed even at 200° C.

EXAMPLE 6

The composition solution obtained in Example 5 was spin-coated on a 4-inch silicon wafer by a spinner so that the film thickness became 1.0 μm and then prebaked on a hot plate at 90° C. for 120 seconds. This was exposed through a test reticle to g rays and then baked on a hot plate at 110° C. for 120 seconds. The resulting resist was developed in the same manner as in Example 5 to find that the photospeed was 75 mJ/cm$^2$ and a negative type line-and-space pattern of 0.46 μm was obtained. In this case, the yield of residual film thickness was 93%.

The wafer having formed thereon said resist pattern was subjected to measurement of thermal resistance to find that the pattern was not deformed even at 200° C.

EXAMPLE 7

The same procedure as in Example 6 was repeated, except that the 0.1 g of 2-(4-methoxystyryl)- 4,6-bis(trichloromethyl)-1,3,5-triazine in the composition solution was replaced with 0.05 g of 2-[2-( 5-methylfuryl)ethylidene]-4, 6-bis(trichloromethyl)- 1,3,5-triazine. The photospeed was 55 mJ/cm$^2$, and a negative type line-and-space pattern of 0.46 μm was obtained. In this case, the yield of residual film thickness was 93%.

The wafer having formed thereon said resist pattern was subjected to measurement of thermal resistance on a hot plate to find that the pattern was not deformed even at 200° C.

EXAMPLE 8

In 17.0 g of methyl 3-methoxypropionate were dissolved 7.0 g of the novolak resin B, 3.0 g of polyvinylphenol (Mw=4,500), 2.0 g of hexamethoxymethylmelamine and 0.05 g of 2-[1-(3,4-benzodioxolyl)]- 4,6-bis(trichloromethyl)-1,3,5-triazine, and the resulting solution was filtered through a membrane filter having a pore diameter of 0.5 μm to prepare a composition solution. This composition solution was spin-coated on a 4-inch silicon wafer by a spinner so that the film thickness became 5.6 μm and then prebaked on a hot plate at 90° C. for 70 seconds. This was exposed through a test reticle to i rays, and then baked on a hot plate at 90° C. for 120 seconds. The thus baked resist was subjected to double puddle development with a 2.38% by weight aqueous tetramethylammonium hydroxide solution at 25° C. for 60 seconds. After the development, the resist was observed by a scanning type electron microscope to find that the photospeed was 175 mJ/cm$^2$, and a negative type line-and-space pattern of 1.2 μm was obtained. In this case, the yield of residual film thickness was 94%.

The wafer having formed thereon said resist pattern was subjected to measurement of thermal resistance on a hot plate to find that the pattern was not deformed even at 200° C.

COMPARATIVE EXAMPLE 3

The same procedure as in Example 8 was repeated, except that the polyvinylphenol was replaced with 10.0 g of the novolak resin B. The unexposed portions were not developed and no resist pattern was obtained.

What is claimed is:

1. A radiation sensitive resin composition which comprises:
   (A) an alkali-soluble novolak resin,
   (B) a phenolic compound other than (A) having a standard polystyrene-reduced weight average molecular weight of 10,000 or less as measured by a gel permeation chromatography,
   (C) a compound capable of cross-linking the components (A) and (B) in the presence of an acid, and
   (D) a radiation sensitive acid generator represented by formula (I):

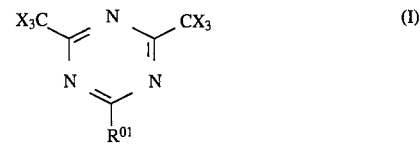

wherein $R^{01}$ represents a trihalomethyl group, a substituted or unsubstituted phenyl group or a substituted or unsubstituted naphthyl group, and X's may be the same as or different from one another and each represents a halogen atom, by formula (II):

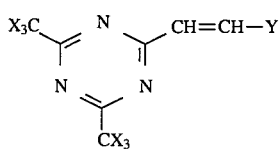

wherein X's may be the same as or different from one another and each represents a halogen atom, Y represents

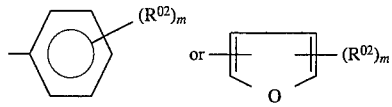

and $R^{02}$ represents a hydrogen atom, an alkyl group, a hydroxyl group or an alkoxy group, and m represents an integer of 1 to 5, provided that when m is 2 or more, the plural $R^{02}$ groups may be the same as or different from one another, or by formula (III):

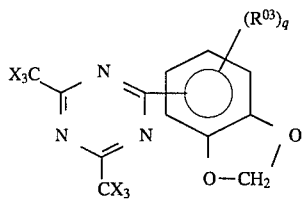

wherein $R^{03}$ represents a hydrogen atom, an alkyl group, a hydroxyl group or an alkoxy group, X's may be the same as or different from one another and each represents a halogen atom and q represents an integer of 1 to 3, provided that when q is 2 or 3 the plural $R^{03}$ groups may be the same as or different from one another.

2. The radiation sensitive resin composition according to claim 1, wherein the phenolic compound (B) is a polyvinylphenol having a standard polystyrene-reduced weight average molecular weight of 10,000 or less as measured by a gel permeation chromatography.

3. The radiation sensitive resin composition according to claim 1, wherein the phenolic compound (B) is a low molecular weight phenolic compound having a standard polystyrene-reduced weight average molecular weight of 1,000 or less as measured by a gel permeation chromatography.

4. The radiation sensitive resin composition according to claim 1, 2 or 3, wherein the radiation sensitive acid generator (D) is tris(trihalomethyl)-triazine represented by formula (I) in which R is a trihalomethyl group.

5. The radiation sensitive resin composition according to claim 4, wherein the tris(trihalomethyl)-triazine is 2,4,6-tris(trichloromethyl)-1,3,5-triazine or 2,4,6-tris(tribromomethyl)-1,3,5-triazine.

6. The radiation sensitive resin composition according to claim 1, 2or 3, wherein the radiation sensitive acid generator (D) is a substituted or unsubstituted phenyl-bis(trihalomethyl)triazine represented by formula (I) in which $R^{01}$ is a substituted or unsubstituted phenyl group.

7. The radiation sensitive resin composition according to claim 6, wherein the substituted or unsubstituted phenyl-bis(trihalomethyl)triazine is 2-phenyl- 4,6-(trichloromethyl)-1,3,5-triazine, 2-phenyl- 4,6-bis(tribromomethyl)-1,3,5-triazine, 2-(4-methoxy-phenyl)- 4,6-bis(trichloromethyl)-1,3,5-triazine, 2-(4-methoxyphenyl)-4,6-bis(tribromomethyl)-1,3,5-triazine, 2-(4-chlorophenyl)-4,6-bis(trichloromethyl)-1,3,5-triazine, 2-(4-chlorophenyl)-4,6-bis(tribromomethyl)- 1,3,5-triazine, 2-(3-chlorophenyl)- 4,6-bis(trichloromethyl)- 1,3,5-triazine or 2-(3-chlorophenyl)-4,6-bis(tribromomethyl)- 1,3,5-triazine.

8. The radiation sensitive resin composition according to claim 1, 2 or 3, wherein the radiation sensitive acid generator (D) is a substituted or unsubstituted naphthyl-bis(trihalomethyl)triazine represented by formula (I) in which $R^0$ is a substituted or unsubstituted naphthyl group.

9. The radiation sensitive resin composition according to claim 8, wherein the substituted or unsubstituted naphthyl-bis(trihalomethyl)triazine is 2-( 1-naphthyl)-4,6-bis(trichloromethyl)-1,3,5-triazine, 2-( 1-naphthyl)-4,6-bis(tribromomethyl)-1,3,5-triazine, 2-( 4-methoxy-l-naphthyl)-4,6-bis(trichloromethyl)-1,3,5triazine or 2-(4-methoxy-1-naphthyl)-4,6-bis(tribromomethyl)- 1,3,5-triazine.

10. The radiation sensitive resin composition according to claim 1, 2 or 3, wherein the radiation sensitive acid generator (D) is a compound represented by formula (II) in which Y is a

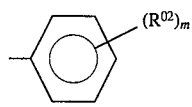

group.

11. The radiation sensitive resin composition according to claim 10, wherein the compound represented by formula (II) in which Y is

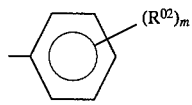

group is 2-styryl-4,6-bis(trichloromethyl)-1,3,5-triazine, 2-styryl- 4,6-bis(tribromomethyl)-1,3,5-triazine, 2-(4-methoxystyryl)- 4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)- 1,3,5-triazine or 2-(3,4,5-trimthoxystyryl)-4,6-bis(tribromomethyl)- 1,3,5-triazine.

12. The radiation sensitive resin composition according to claim 1, 2 or 3, wherein the radiation sensitive acid generator (D) is a compound represented by formula (II) in which Y is a

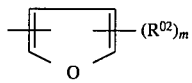

group.

13. The radiation sensitive resin composition according to claim 12, wherein the compound represented by formula (II) in which Y is a

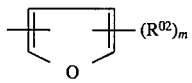

group is 2-(2-furyl-ethylidene)-4,6-bis(trichloromethyl)-1,3, 5-triazine, 2-[2-(5-methylfuryl)ethylidene]-4,6-bis(trichloromethyl)- 1,3,5-triazine, 2-[2-(4methylfuryl)ethylidene] -4,6-bis(trichloromethyl)-4,6-triazine, 2-[2-(3-methylfuryl) ethylidene]-4,6-bis (trichloromethyl)- 1,3,5-triazine, 2-[2-(4,5dimethylfuryl)ethylidene] -4,6-bis(trichloromethyl)- 1,3,5-triazine, 2-[2-(5-methoxyfuryl)ethylidene)-4,6-bis-(trichloromethyl)- 1,3,5-triazine, 2-[2-(4-methoxyfuryl)ethylidene] -4,6-bis(trichloromethyl)-1,3,5-triazine, 2-[2-(3-methoxyfuryl)ethylidene]-4,6-bis(trichloromethyl)- 1,3,5-triazine, 2-(2-furylethylidene)-4,6-bis-(tribromomethyl)-

1,3,5-triazine, 2-[2-(5-methylfuryl)ethylidene] -4,6-bis(tribromomethyl)-1,3,5-triazine, 2-[ 2-(4-methylfuryl)ethylidene)-4,6-bis(tribromomethyl)- 1,3,5-triazine, 2-[2-(3-methylfuryl)ethylidene]-4,6-bis(tribromomethyl)- 1,3,5-triazine, 2-[2-(4,5dimethylfuryl)ethylidene] -4,6-bis(tribromomethyl)-1,3,5triazine, 2-[2-(5-methoxyfuryl)ethylidene]-4,6-tri(bromomethyl)- 1,3,5-triazine, 2-[2-(4-methoxyfuryl)ethylidene] -4,6-bis(tribromomethyl)-1,3,5-triazine, 2-[ 2-(3-methoxyfuryl)ethylidene]-4,6-bis(tribromomethyl)- 1,3,5-triazine or 2-[2-(4,5-dimethoxyfuryl)ethylidene]- 4,6-bis(tribromomethyl)-1,3,5-triazine.

14. The radiation sensitive resin composition according to claim 1, 2 or 3, wherein the radiation sensitive acid generator (D) is a compound represented by formula (III).

15. The radiation sensitive resin composition according to claim 14, wherein the compound represented by formula (III) is 2-[1-(3,4-benzodioxolyl)]-4,6-bis(trichloromethyl)-1,3,5-triazine, 2-[1-(2,3-benzodioxolyl)] -4,6-bis(trichloromethyl)-1,3,5-triazine, 2-[1-(3,4-benzodioxolyl)]-4,6-bis-(tribromomethyl)-1,3,5-triazine or 2-[1-(2,3-benzodioxolyl)-4,6-bis(tribromomethyl)- 1,3,5-triazine.

16. The radiation sensitive resin composition according to claim 1, 2, or 3, wherein the radiation sensitive acid generator (D) is 2-(4-methoxy-1-naphthyl)- 4,6-bis(trichloromethyl)-1,3,5-triazine or 2,4-bis(trichloromethyl)-6-(3-chlorophenyl)-1,3,5-triazine, 2-(4-methoxystyryl)-4,6-bis(trichloromethyl)- 1,3,5-triazine, 2-([2-(5-methylfuryl)ethylidene ]-4,6-bis(trichloromethyl)- 1,3,5-triazine or 2-[1-(3,4-benzodioxolyl)]-4,6-bis ( trichloromethyl ) -1,3,5-triazine.

17. The radiation sensitive resin composition according to claim 1, whrein the amount of the alkali-soluble resin (A) is 100 parts by weight, the amount of the phenolic compound (B) is 0.1 to 300 parts by weight, the amount of the compound (C) cross-linking the components (A) and (B) is 1 to 100 parts by weight and the amount of the radiation sensitive acid generator (D) is 0.01 to 20 parts by weight.

18. The radiation sensitive resin composition according to claim 1, wherein the radiation is g ray, i ray or deep ultraviolet ray.

* * * * *